(12) United States Patent
Liang

(10) Patent No.: US 11,522,076 B2
(45) Date of Patent: Dec. 6, 2022

(54) FIELD EFFECT TRANSISTOR, METHOD OF FABRICATING FIELD EFFECT TRANSISTOR, AND ELECTRONIC DEVICE

(71) Applicants: BEIJING HUA TAN YUAN XIN ELECTRONICS TECHNOLOGY CO., LTD, Beijing (CN); BEIJING HUATAN TECHNOLOGY CO., LTD, Beijing (CN)

(72) Inventor: Shibo Liang, Beijing (CN)

(73) Assignees: BEIJING HUA TAN YUAN XIN ELECTRONICS, Beijing (CN); BEIJING HUATAN TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 16/772,742

(22) PCT Filed: Oct. 17, 2018

(86) PCT No.: PCT/CN2018/110631
§ 371 (c)(1),
(2) Date: Jun. 12, 2020

(87) PCT Pub. No.: WO2019/114408
PCT Pub. Date: Jun. 20, 2019

(65) Prior Publication Data
US 2020/0328294 A1    Oct. 15, 2020

(30) Foreign Application Priority Data
Dec. 14, 2017 (CN) .......................... 201711337902.4

(51) Int. Cl.
*H01L 29/66* (2006.01)
*H01L 29/16* (2006.01)
(Continued)

(52) U.S. Cl.
CPC .... *H01L 29/7606* (2013.01); *H01L 21/02527* (2013.01); *H01L 29/1606* (2013.01); *H01L 29/66045* (2013.01)

(58) Field of Classification Search
CPC ............... H01L 29/66984; H01L 29/78; H01L 29/7839; H01L 29/78684; H01L 29/786;
(Continued)

(56) References Cited

U.S. PATENT DOCUMENTS 8,680,511 B2 * 3/2014 Dimitrakopoulos ......................... H01L 21/02378
257/24
9,455,256 B2 * 9/2016 Heo .................... H01L 29/7827
(Continued)

FOREIGN PATENT DOCUMENTS

CN    103208524 A    7/2013
CN    106356405 A    1/2017
(Continued)

OTHER PUBLICATIONS

International Search Report and Written Opinion of the International Searching Authority issued in PCT/CN2018/110631, dated Jan. 16, 2019; ISA/CN.
(Continued)

*Primary Examiner* — Natalia A Gondarenko
(74) *Attorney, Agent, or Firm* — Harness, Dickey & Pierce, P.L.C.

(57) ABSTRACT

A field effect transistor (FET), a method of fabricating a field effect transistor, and an electronic device, the field effect transistor comprises: a source and a drain, the source being made of a first graphene film; a channel disposed between the source and the drain, and comprising a laminate of a second graphene film and a material layer having semiconductor properties, the second graphene film being formed of (Continued)

bilayer graphene; and a gate disposed on the laminate and electrically insulated from the laminate.

20 Claims, 10 Drawing Sheets

(51) Int. Cl.
*H01L 29/76* (2006.01)
*H01L 21/02* (2006.01)

(58) Field of Classification Search
CPC ... H01L 29/1606; H01L 29/16; H01L 29/161; H01L 29/18; H01L 29/4232; H01L 21/28568; H01L 21/02527; H01L 21/02376; H01L 2924/01103; H01L 29/0673; H01L 29/0665; H01L 29/8696; H01L 29/66742; H01L 29/1054; H01L 29/267; H01L 29/778; H01L 29/423; H01L 29/42372; H01L 29/66409; H01L 29/66045; H01L 29/7391; H01L 29/66015; H01L 29/66356; H01L 29/7606; H01L 29/0649; H01L 29/2253; H01L 29/78696; H01L 29/78693; H01L 29/247; H01L 29/4236; H01L 29/66; H01L 29/66477; H01L 21/042; H01L 21/02565; B82Y 30/00; B82Y 20/00; B82Y 10/00; Y02E 10/544
USPC .............. 257/27, 29, 288, E29.04, E29.068
See application file for complete search history.

(56) References Cited

U.S. PATENT DOCUMENTS

| | | | |
|---|---|---|---|
| 9,735,233 B2* | 8/2017 | Heo | H01L 29/78 |
| 2012/0049160 A1* | 3/2012 | Sano | H01L 21/823807 |
| | | | 257/27 |
| 2012/0181506 A1* | 7/2012 | Farmer | H01L 29/1606 |
| | | | 257/29 |
| 2013/0175506 A1* | 7/2013 | Heo | H01L 29/0673 |
| | | | 257/29 |
| 2015/0129839 A1* | 5/2015 | Woo | H01L 29/78684 |
| | | | 257/29 |
| 2015/0228859 A1 | 8/2015 | Morreale | |
| 2015/0280012 A1 | 10/2015 | Sato et al. | |
| 2016/0020280 A1* | 1/2016 | Heo | H01L 29/7869 |
| | | | 257/27 |
| 2017/0054033 A1* | 2/2017 | Lee | H01L 21/02565 |

FOREIGN PATENT DOCUMENTS

| | | |
|---|---|---|
| CN | 106653854 A | 5/2017 |
| CN | 106952949 A | 7/2017 |
| CN | 108054209 A | 5/2018 |
| JP | 2017152644 A | 8/2017 |
| WO | WO-2019114408 A1 | 6/2019 |

OTHER PUBLICATIONS

First Office Action issued in Chinese Application No. 201711337902.4, dated Feb. 26, 2019 (with English Translation).

* cited by examiner

FIELD EFFECT TRANSISTOR, METHOD OF FABRICATING FIELD EFFECT TRANSISTOR, AND ELECTRONIC DEVICE

CROSS-REFERENCE TO RELATED APPLICATIONS

This application is a U.S. National Phase application based upon PCT Application No. PCT/CN2018/110631, filed on Oct. 17, 2018, which claims the priority of Chinese Patent Application No. 201711337902.4, filed on Dec. 14, 2017, and the disclosures of which are hereby incorporated by reference.

FIELD

The present application relates to the field of a semiconductor device, and specifically a field effect transistor (FET), a method of fabricating a field effect transistor, and an electronic device.

BACKGROUND

A metal-oxide-semiconductor field effect transistor (MOS FET) is a basic component for building an integrated circuit. Switch state transition of a MOS FET is realized by applying a voltage on the gate of the deive to control a source-drain current thereof. A turn-off speed is described by a subthreshold swing (SS), wherein the subthreshold swing is a gate voltage increment that needs to be applied to vary the source-drain current by one order of magnitude. The smaller the subthreshold swing is, the faster the transistor turns off. Due to limitations of the thermal excitation mechanism, the theoretical minimum value of the subthreshold swing of a conventional FET at room temperature is 60 mV/Dec. In general, due to parasitic effects and insufficient gate efficiency, subthreshold swings are greater than 60 mV/Dec. Further developments of integrated circuits require that the operating voltage continues to decrease, while the thermal excitation limit of 60 mV/Dec for the subthreshold swing in MOS FETs limits the operating voltage of integrated circuits to less than 0.64 V, limiting a further reduction of power consumption of the integrated circuits. Therefore, to further promote developments of complementary metal oxide semiconductor (CMOS) technology, and to realize integrated circuits of ultra-low power consumption, it is necessary to break the limit on the sub-threshold swing by the thermal excitation mechanism of conventional MOSFETs to implement transistors having a subthreshold swing of less than 60 mV/Dec.

At present, researches on realizing low subthreshold swings have focused on tunnel transistors (Tunnel FETs). A heavily doped n-p tunneling junction is formed in the channel of the tunnel transistor, carriers only can be transported from a source to a drain by inter-band tunneling, and tunneling current is controlled by adjusting the thickness of the tunneling junction by the gate voltage, thereby realizing a switch state transition of the transistor. When the tunnel transistor is turned off, the physical limit of the thermal excitation on the turn-off speed in conventional FET devices is eliminated, realizing a subthreshold swing of less than 60 mV/Dec at room temperature. However, presence of the tunneling junction also greatly reduces the drive current of the tunnel transistor. The maximum on-state current of the tunnel transistor currently realized is merely 1% of that of a normal transistor. Specifically, the maximum current of the tunnel transistor with a subthreshold swing of less than 60 mV/Dec at room temperature is 1-10 nA/μm, which does not meet requirements of the International Technology Roadmap for Semiconductors (ITRS). Under this circumstance, the operating speeds of the device and the circuit are greatly reduced, thereby failing to meet the working needs of a normal integrated circuit. Thus such a tunnel transistor has no practical value.

BRIEF SUMMARY

According to a first aspect of the present disclosure, a field effect transistor is provided, comprising: a source and a drain, the source being made of a first graphene film; a channel disposed between the source and the drain, and comprising a laminate of a second graphene film and a material layer having semiconductor properties, the second graphene film being formed of bilayer graphene; and a gate disposed on the laminate and electrically insulated from the laminate.

According to at least one embodiment of the present disclosure, the source is in electrical contact with the channel.

According to at least one embodiment of the present disclosure, the first graphene film and the second graphene film are formed of the same bilayer graphene film.

According to at least one embodiment of the present disclosure, the first graphene film and the second graphene film are both bilayer graphene films of an AB stack type.

According to at least one embodiment of the present disclosure, the material layer having semiconductor properties is n-doped or p-doped.

According to at least one embodiment of the present disclosure, the field effect transistor further comprises a gate insulating layer formed on the channel and having an equivalent oxide thickness of less than 2 nm.

According to at least one embodiment of the present disclosure, the drain is formed of the material layer having semiconductor properties.

According to at least one embodiment of the present disclosure, the drain is formed of a metal or a third graphene film.

According to at least one embodiment of the present disclosure, the material layer having semiconductor properties is formed by at least one of: a carbon nanotube, a semiconductor nanowire, a two-dimensional semiconductor material, and a three-dimensional semiconductor material.

According to a second aspect of the present disclosure, a method of fabricating a field effect transistor is provided, comprising: forming a channel on a substrate; forming a source and a drain on the substrate, such that the channel is disposed between the source and the drain; and forming a gate on the channel such that a projection of the gate on the substrate overlaps with a projection of the channel on the substrate, wherein the source is formed of a first graphene film, the channel comprises a laminate of a second graphene film and a material layer having semiconductor properties, the second graphene film being formed of bilayer graphene, and the gate is electrically insulated from the laminate.

According to at least one embodiment of the present disclosure, the step of forming a source and a drain on the substrate further comprises electrically contacting the source with the channel.

According to at least one embodiment of the present disclosure, the first graphene film and the second graphene film are formed of the same bilayer graphene film.

According to at least one embodiment of the present disclosure, the first graphene film and the second graphene film are both bilayer graphene films of an AB stack type.

According to at least one embodiment of the present disclosure, the material layer having semiconductor properties is n-doped or p-doped.

According to at least one embodiment of the present disclosure, the method further comprises forming a gate insulating layer on the channel, wherein the gate insulating layer has an equivalent oxide thickness of less than 2 nm.

According to at least one embodiment of the present disclosure, the step of forming a source and a drain on the substrate further comprises forming the drain with the material layer having semiconductor properties.

According to at least one embodiment of the present disclosure, the step of forming a source and a drain on the substrate further comprises forming the drain with a metal or a third graphene film.

According to at least one embodiment of the present disclosure, the material layer having semiconductor properties is formed by at least one of: a carbon nanotube, a semiconductor nanowire, a two-dimensional semiconductor material, and a three-dimensional semiconductor material.

According to a third aspect of the present disclosure, an electronic device comprising a field effect transistor is provided, comprising: a source and a drain, the source being made of a first graphene film; a channel disposed between the source and the drain, and comprising a laminate of a second graphene film and a material layer having semiconductor properties, the second graphene film being formed of bilayer graphene; and a gate disposed on the laminate and electrically insulated from the laminate.

BRIEF DESCRIPTION OF THE DRAWINGS

The figures illustrate exemplary embodiments of the present disclosure, and, together with their depictions, are used to explain the principles of the present disclosure. The figures, which are included and constitute part of the Description are provided to provide a further understanding of the present disclosure.

DETAILED DESCRIPTION

Figure 1:
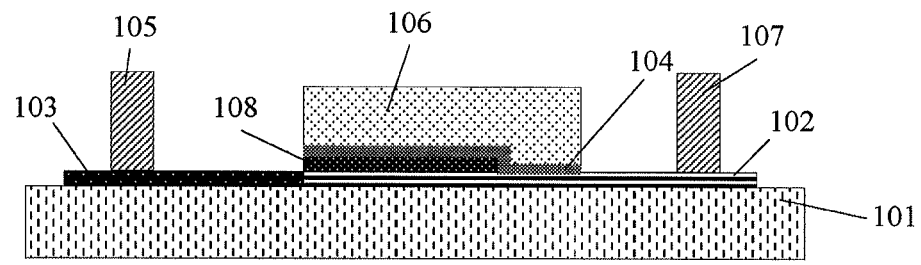
FIG. 1 exemplarily shows a schematic structural view of a field effect transistor according to an embodiment of the present disclosure.

The present disclosure will be further described in detail below in conjunction with the Drawings and embodiments. It is to be understood that the specific embodiments described herein are only for the purpose of illustration, instead of limiting the present disclosure. It is to be noted that, for the convenience of depictions, only parts related to the present disclosure are shown in the drawings.

It is also to be noted that under the circumstance of no conflicts, the features in the embodiments and the embodiments in the present disclosure may be combined with each other. The present disclosure will be described in detail below with reference to the Drawings and embodiments.

FIG. 1 shows a schematic structural view of a field effect transistor according to an embodiment of the present disclosure. As shown in FIG. 1, a field effect transistor according to an embodiment of the present disclosure may be formed on a substrate 101. The rigidity of the substrate 101 is sufficient to provide support for the device during fabricating operations. The substrate 101 can be an amorphous or crystalline material. By way of example, the substrate 101 can be glass, sapphire, silicon, polymer, silicon-on-insulator, or any other substrate on which an insulating layer can be deposited. Embodiments of the present disclosure are not limited to the above-described substrates, because the semiconductor properties of field effect transistors according to embodiments of the present disclosure are not dependent on semiconductor characteristics of these substrates.

A material 102 may be disposed on the substrate 101. The material 102 has electrical properties of a semiconductor. For example, the materials 102 may include carbon nanotubes, semiconductor nanowires, two-dimensional semiconductor materials (such as black phosphorus and molybdenum disulfide), or three-dimensional semiconductor materials (such as silicon). However, the present disclosure is not limited thereto. Furthermore, for electronic transistors, the material 102 is n-doped such that the material 102 has such electrical properties as an n-type semiconductor (e.g., electrons become primary carriers), and for hole-type transistors, the material 102 is p-doped such that the material 102 has such electrical properties as a p-type semiconductor (e.g., holes become primary carriers). The material 102 can be doped by, for example, a high temperature thermal diffusion technique or an ion implantation technique. The material 102 can be formed on the substrate 101 with chemical methods such as chemical vapor deposition or physical methods such as coating. Alternatively, the surface of the substrate 101 may also be doped to form the material 102. For example, when the substrate 101 is silicon-on-insulator, the silicon may be doped to form the material 102. In FIG. 1, the material 102 is in direct contact with the substrate 101. However, those skilled in the art should appreciate that other layers or elements may be present between the material 102 and the substrate 101.

A first graphene film 103 is further disposed on the substrate 101. Further, as shown in FIG. 1, the first graphene film 103 is in electrical contact with the material 102. In the embodiment shown in FIG. 1, the drain corresponding to the drain 107 is also formed of the material 102. By forming the drain and the channel from the same layer of material, the method of fabricating a field effect transistor can be simplified, the cost can be reduced, and the fabricating time can be shortened. The first graphene film 103 may be formed of a single layer graphene or a bilayer graphene. The bilayer graphene may be in the form of an AB stack type or an AA stack type. The AB stack type means that half of the atoms are above the center of the hexagon of the underlying graphene and half of the atoms are above the atoms of the underlying graphene; and the AA stack type means that the two layers are just aligned. In a possible embodiment of the present disclosure, the first graphene film 103 is formed of bilayer graphene in the form of an AB stack type.

A second graphene film 108 may be disposed on the material 102. The second graphene film 108 can be laminated with a portion of the material 102. Similarly, the second graphene film 108 may be in the form of an AB stack type or an AA stack type. In the case where the first graphene film 103 is formed of bilayer graphene, the second graphene film 108 may be the same as the first graphene film 103, and for example, formed of a bilayer graphene of an AB stack type. In a possible embodiment of the present disclosure, the first graphene film 103 and the second graphene film 108 may be formed of the same bilayer graphene. In an embodiment of the present disclosure, the first graphene film 103 and the second graphene film 108 may be prepared in advance. The bilayer graphene can be prepared with methods such as physical stripping or chemical vapor deposition.

As shown in FIG. 1, the source 105 may be disposed on the first graphene film 103, and the drain 107 may be disposed on the material 102. The source 105 and the drain 107 are formed of a conductive material such as Al or Pd. The source 105 and the drain 107 may be formed of the same material or may be formed of different materials. The source 105 and the drain 107 can be formed, for example, by processes such as thin film growth, photolithography, etching and the like.

The gate insulating layer 104 may be laminated with the second graphene film 108. For example, the gate insulating layer 104 may include HfO2, Y2O3 or other insulating materials. The gate insulating layer 104 can be formed with a method such as atomic layer deposition. Although the gate insulating layer 104 and the second graphene film 108 are only shown to cover a portion of the material 102 in FIG. 1, those skilled in the art will appreciate that the gate insulating layer 104 and the second graphene film 108 may also cover the entire surface of the material 102. When the gate insulating layer 104 and the second graphene film 108 cover the entire surface of the material 102, the drain 107 may be in contact with the material 102 through via holes formed in the gate insulating layer 104 and the second graphene film 108. Although the projected area of the second graphene film 108 on the material 102 can be less than the projected area of the gate insulating layer 104 on the material 102 in FIG. 1, those skilled in the art will appreciate that the projected area of the second graphene film 108 on the material 102 may also be greater than or equal to the projected area of the gate insulating layer 104 on the material 102. In addition, the equivalent oxide thickness (EOT) of the gate insulating layer 104 may be less than 2 nm. The equivalent oxide thickness as referred to herein means the equivalent thickness of a thin layer of any dielectric material by regarding the dielectric material as silicon dioxide equivalently.

Figure 2:
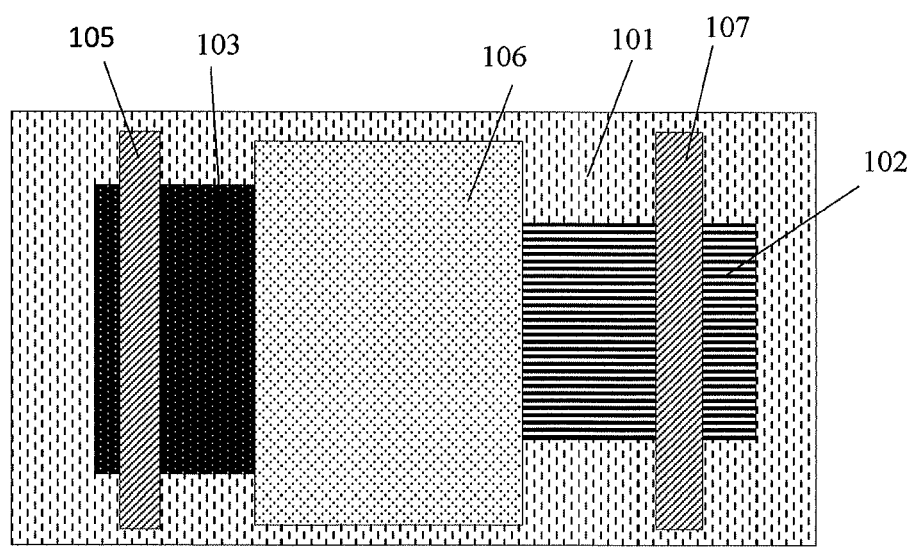
FIG. 2 exemplarily shows a top view of a field effect transistor according to an embodiment of the present disclosure.

The gate 106 may be disposed on the gate insulating layer 104 and electrically insulated from the material 102 by the gate insulating layer 104. The projection of the gate 106 on the material 102 at least partially overlaps with the projection of the gate insulating layer 104 and the second graphene film 108 on the material 102, and the projected area of the gate 106 on the material 102 can be less than or equal to the projected area of the gate insulating layer 104 or the second graphene film 108 on the material 102. For example, FIG. 2 shows that the projected area of the gate 106 on material 102 is equal to the projected area of the gate insulating layer 104 on material 102. In a possible embodiment of the present disclosure, the projected area of the gate 106, the gate insulating layer 104, and the second graphene film 108 on the material 102 may be equal. The gate 106 may be formed of a conductive material such as Al or Pd. The gate 106, the source 105 and the drain 107 may be formed of the same or different materials, and the present disclosure is not limited thereto. Similarly, the gate 106 can be formed, for example, by processes such as thin film growth, photolithography, etching and the like. The gate 106 can convert the second graphene film 108 into a narrow bandgap semiconductor by applying a voltage, thereby realizing a narrow bandgap/wide bandgap heterojunction channel. On the other hand, by controlling the thickness of the heterojunction formed by the second graphene film 108 and the material 102 by the gate 106, switch state transition of the field effect transistor can be realized.

Figure 3:
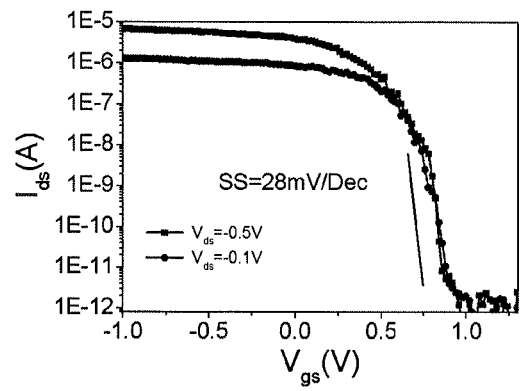
FIG. 3 exemplarily shows a transfer curve of an example of a field effect transistor according to an embodiment of the present disclosure.

FIG. 3 illustrates a transfer curve of an example of a field effect transistor in accordance with an embodiment of the present disclosure. Specifically, FIG. 3 illustrates a transfer curve at room temperature of an example of a field effect transistor according to a specific embodiment of the present disclosure, the transfer curve representing a relationship between a source-drain current Ids and a gate source voltage Vgs. The room temperature referred to herein means 300K. The field effect transistor in the present embodiment has a structure similar to that shown in FIG. 1. In FIG. 3, it can be observed that in the present embodiment, in the case where the source-drain voltage is −0.5 V and −0.1 V, a subthreshold swing of less than 60 mV/Dec, specifically 28 mV/Dec, can be obtained. Thus, a field effect transistor in accordance with an embodiment of the present disclosure can realize a subthreshold swing that is less than the theoretical minimum value of a subthreshold swing of a conventional field effect transistor at room temperature (i.e., 60 mV/Dec). Moreover, those skilled in the art will appreciate that the above-described subthreshold swing of 28 mV/Dec is only a subthreshold swing realized by one example of a field effect transistor according to an embodiment of the present disclosure. However, the field effect transistor according to an embodiment of the present disclosure can also realize other subthreshold swings of less than 60 mV/Dec, such as about 50 mV/Dec, about 40 mV/Dec, and about 28 mV/Dec.

Figure 4:
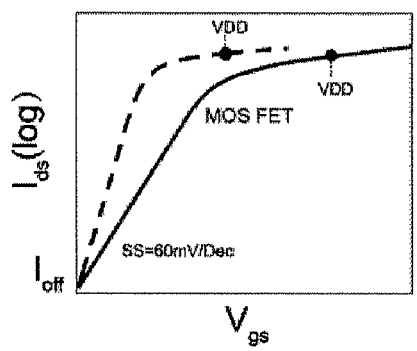
FIG. 4 exemplarily shows a comparison of transfer characteristics of a conventional field effect transistor with those of a field effect transistor according to an embodiment of the present disclosure.

FIG. 4 schematically shows a comparison of transfer characteristics of a conventional field effect transistor at room temperature with those of a field effect transistor according to an embodiment of the present disclosure. In FIG. 4, the solid line represents the transfer characteristic of a conventional field effect transistor having a subthreshold swing of 60 mV/Dec, and the dashed line represents the transfer characteristic of the field effect transistor according to an embodiment of the present disclosure. Since a field effect transistor according to an embodiment of the present disclosure can obtain a subthreshold swing of less than 60 mV/Dec, a field effect transistor according to an embodiment of the present disclosure can obtain a smaller operating voltage VDD with respect to a conventional field effect transistor, and an on-state current having a magnitude approximate to that of the on-state current of a conventional field effect transistor can be obtained. As an example, a field effect transistor according to an embodiment of the present disclosure may obtain an operating voltage of about 0.5 V, which is lower than an operating voltage of 0.7 V of a current 14 nm process Si MOS FET, and a field effect transistor according to an embodiment of the present disclosure can obtain an on-state current approximately equal to the on-state current of the current 14 nm process Si MOS FET at an operating voltage of 0.5V.

Compared with related arts, the field effect transistor according to an embodiment of the present disclosure can realize a subthreshold swing of less than 60 mV/Dec at room temperature, and can realize a smaller operating voltage, a similar on-state current and a smaller off-state current, reducing power consumption.

Figure 5:
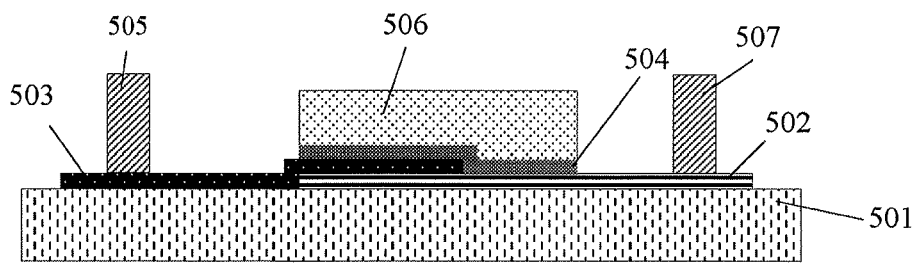
FIG. 5 exemplarily shows a schematic structural view of a field effect transistor according to an embodiment of the present disclosure.

FIG. 5 shows a schematic structural view of a field effect transistor according to an embodiment of the present disclosure. The substrate 501, the material 502, the Dirac material 503, the gate insulating layer 504, the source 505, the gate 506, and the drain 507 in FIG. 5 are the same as the substrate 101, the material 102, the first graphene film 103, the gate insulating layer 104, the source 105, the gate 106, and drain 107 in FIG. 1 respectively, and thus description of them will not be repeatedly described herein.

In the present embodiment, the first graphene film 503 is also located between the gate insulating layer 504 and the material 502. That is, the graphene film for forming the source and the graphene film in the channel are formed of the same graphene film. Although FIG. 5 shows that the first graphene film 503 overlaps partially with the gate insulating layer 504, it will be understood by those skilled in the art that the first graphene film 503 may completely overlap with the gate insulating layer 504, and the present disclosure is not limited thereto.

Figure 6:
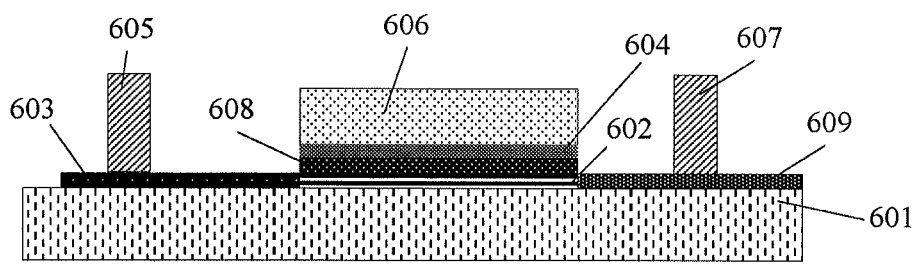
FIG. 6 exemplarily shows a schematic structural view of a field effect transistor according to an embodiment of the present disclosure.

FIG. 6 shows a schematic structural view of a field effect transistor according to an embodiment of the present disclosure. The substrate 601, the material 602, the first graphene film 603, the gate insulating layer 604, the source 605, the gate 606, the drain 607, and the second graphene film 608 in FIG. 6 are the same as the substrate 101, the material 102, the first graphene film 103, the gate insulating layer 104, the source 105, the gate 106, the drain 107, and the second graphene film 108 in FIG. 1 respectively, and thus description of them will not be repeatedly described herein. In the present embodiment, also provided is a third graphene film 609, which is disposed on the substrate 601, and the drain 607 is disposed on the third graphene film 609. The third graphene film 609 forms the drain of the field effect transistor and is in electrical contact with the channel of the field effect transistor. The third graphene film 609 may be formed of single layer graphene or bilayer graphene. When the third graphene film 609 is formed of bilayer graphene, it may be in the form of an AB stack type or an AA stack type. Although FIG. 6 shows that the first graphene film 603, the second graphene film 608, and the third graphene film 609 are different from each other, those skilled in the art should understand that any two or all of the first graphene film 603, the second graphene film 608, and the third graphene film 609 may also be identical to each other, and the present disclosure is not limited thereto.

Similarly, compared with related arts, a field effect transistor having the structure shown in FIG. 5 or 6 can realize a subthreshold swing of less than 60 mV/Dec at room temperature, and can realize a smaller operating voltage, a similar on-state current and a smaller off-state current, reducing power consumption.

Figure 7:
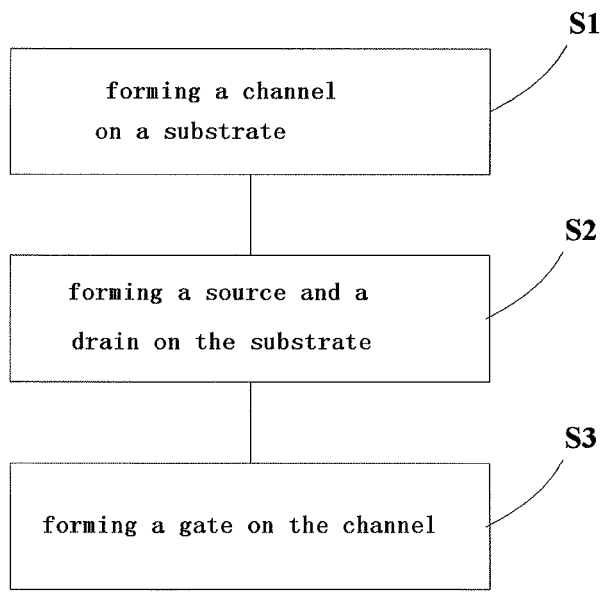
FIG. 7 shows a flow chart of a method of fabricating a field effect transistor according to an embodiment of the present disclosure.

FIG. 7 illustrates a flow chart of a method of fabricating a field effect transistor in accordance with an embodiment of the present disclosure. A method of fabricating a field effect transistor according to an embodiment of the present disclosure comprises:

S1: forming a channel on a substrate;

S2: forming a source and a drain on the substrate, such that the channel is disposed between the source and the drain; and S3: forming a gate on the channel such that a projection of the gate on the substrate overlaps with a projection of the channel on the substrate, wherein the source is formed of a first graphene film, the channel comprises a laminate of a second graphene film and a material layer having semiconductor properties, the second graphene film being formed of bilayer graphene, and the gate is electrically insulated from the laminate.

Figure 8:
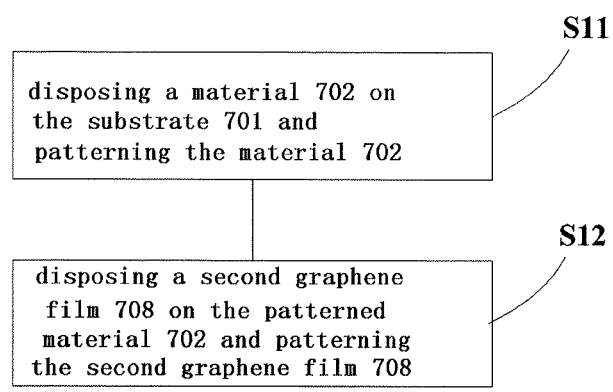
FIG. 8 exemplarily shows a flowchart of steps of forming a channel according to an embodiment of the present disclosure.

As shown in FIG. 8, in an embodiment of the present disclosure, the step of forming a channel on a substrate may include the following sub-steps:

S11: disposing a material 702 on the substrate 701 and patterning the material 702; and S12: disposing a second graphene film 708 on the patterned material 702 and patterning the second graphene film 708.

Figure 9A:
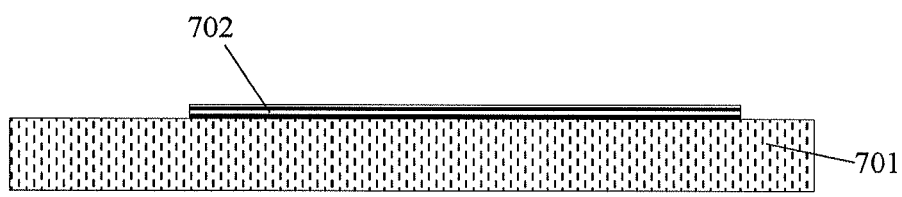
FIGS. 9A-9B exemplarily illustrate a material having semiconductor properties disposed on a substrate and patterned according to an embodiment of the present disclosure.
Figure 9B:
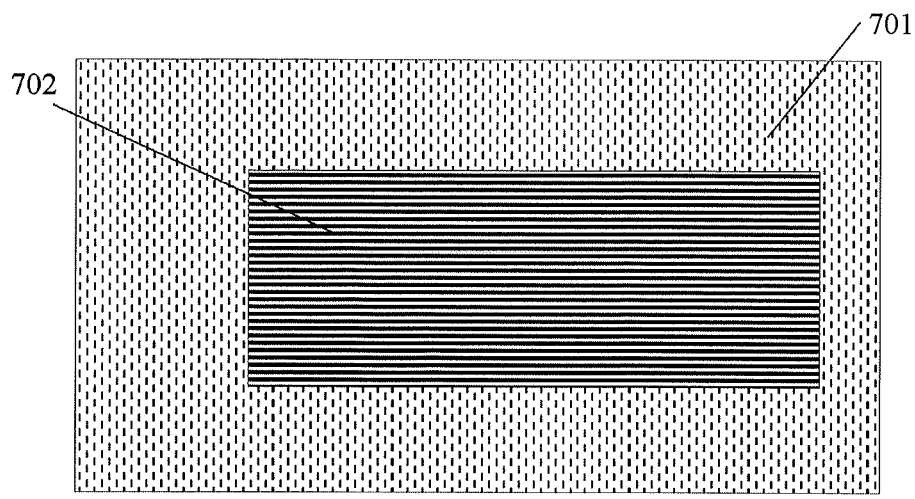
Figure 10A:
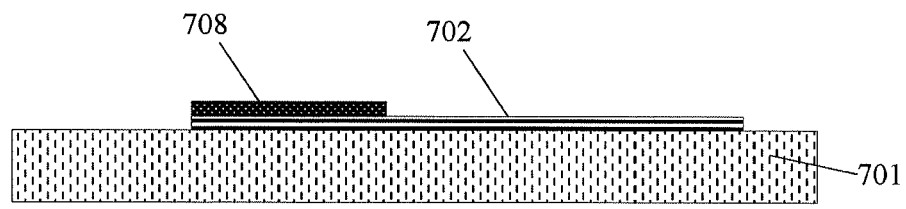
FIGS. 10A-10B exemplarily illustrate a second graphene film disposed on a patterned material and patterned according to an embodiment of the present disclosure.
Figure 10B:
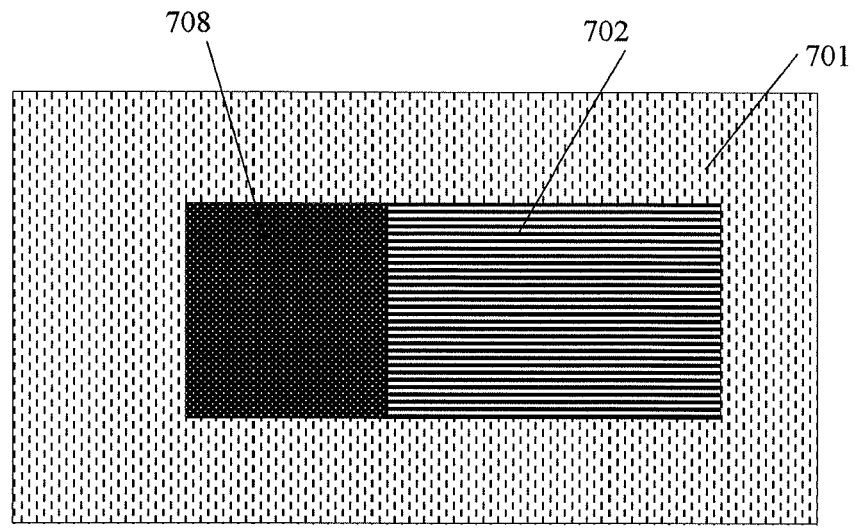

FIGS. 9A-9B exemplarily illustrate a material 702 disposed on a substrate and patterned. FIGS. 10A-10B exemplarily illustrate a second graphene film 708 disposed on a patterned material 702 and patterned. The material 702 can be formed on the substrate 701 with chemical methods (e.g., chemical vapor deposition) or physical methods (e.g., coating). The material 702 has the electrical properties of a semiconductor. For example, the material 702 can include carbon nanotubes, semiconductor nanowires, two-dimensional semiconductor materials (such as black phosphorus and molybdenum disulfide), or three-dimensional semiconductor materials (such as silicon). However, the disclosure is not limited thereto. In the present embodiment, the material 702 may be prepared in advance. The second graphene film 708 can be prepared in advance and then transferred to the material 702. The second graphene film 708 is laminated with a portion of the material 702.

Alternatively, the substrate 701 can be doped to form the material 702. For example, when the substrate 701 is silicon-on-insulator, the silicon can be doped to form the material 702. The material 702 can be formed in direct contact with the substrate 701. However, those skilled in the art will appreciate that other layers or elements can be present between the material 702 and the substrate 701.

Figure 11:
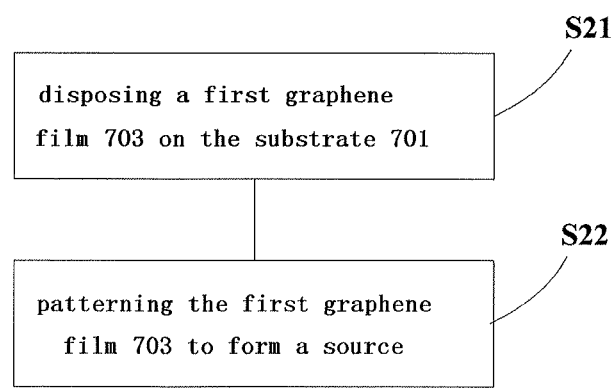
FIG. 11 illustrates a flow chart of steps of forming a source and a drain on a substrate according to an embodiment of the present disclosure.

As shown in FIG. 11, the step of forming a source and a drain on a substrate may include the following sub-steps:

S21: disposing a first graphene film 703 on the substrate 701; and

S22: patterning the first graphene film 703 to form a source.

Figure 12A:
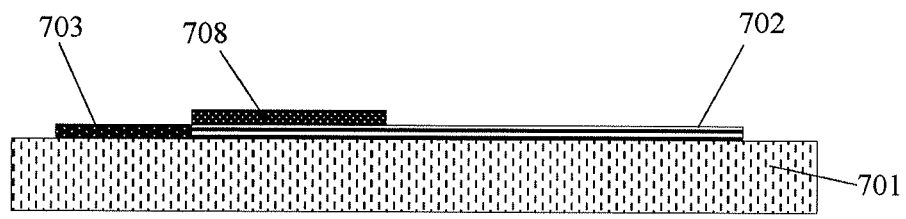
FIGS. 12A-12B exemplarily illustrate disposing on a substrate and patterning a first graphene film according to an embodiment of the present disclosure.
Figure 12B:
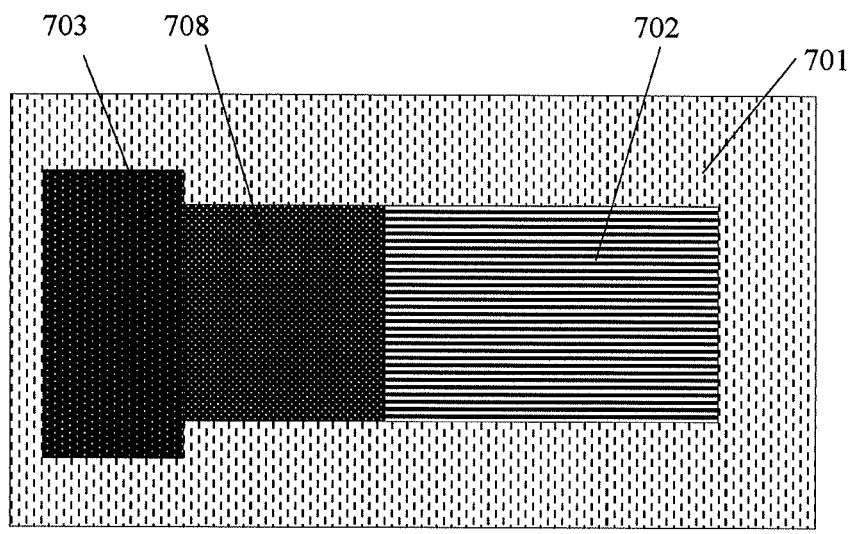

FIGS. 12A-12B exemplarily illustrate a first graphene film 703 disposed on a substrate 701 and patterned. The patterned first graphene film 703 is in electrical contact with the material 702.

In the present embodiment, the drain is also formed of the material 702. In the case where the drain and the channel are both formed of the material 702, the drain and the channel can be formed in the same step. By forming the drain and the channel from the same layer of material, the fabricating method of the field effect transistor can be simplified, the cost can be reduced, and the fabricating time can be shortened. However, it will be understood by those skilled in the art that the drain formed by the third graphene film can also be formed by steps similar to sub-steps S21 and S22, with the drain and the source being formed on both sides of the channel. For example, a third graphene film may be disposed on the substrate 701, and the third graphene film is patterned to form a drain. It should be understood by those skilled in the art that the first graphene film and the third graphene film may be the same or different, and the disclosure is not limited thereto. For example, both the source and the drain can be formed of single layer graphene. In the case where the drain and the source are formed of the same graphene, the drain may be formed by the first graphene film 703 in the sub-step S22. In a possible embodiment of the present disclosure, the first graphene film 703 and the second graphene film 708 may also be formed of the same bilayer graphene film. For example, after patterning the material 702, a bilayer graphene film covering the substrate 701 and the material 702 can be formed, and then the bilayer graphene film can be patterned to form integrally a first graphene film 703 and a second graphene film 708. In another possible embodiment of the present disclosure, the first graphene film 703, the second graphene film 708, and the third graphene film may be formed of the same bilayer graphene film. In another possible embodiment of the present disclosure, the first graphene film 703, the second graphene film 708, and the third graphene film may be different from each other or any two of the three films are identical, and the disclosure is not limited thereto.

Figure 13A:
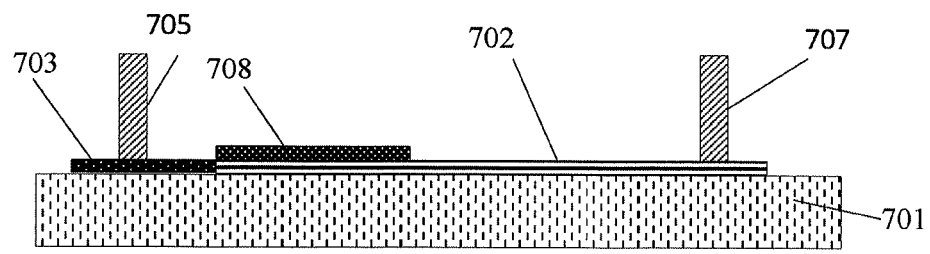
FIGS. 13A-13B exemplarily illustrate steps of forming a source and a drain according to an embodiment of the present disclosure.
Figure 13B:
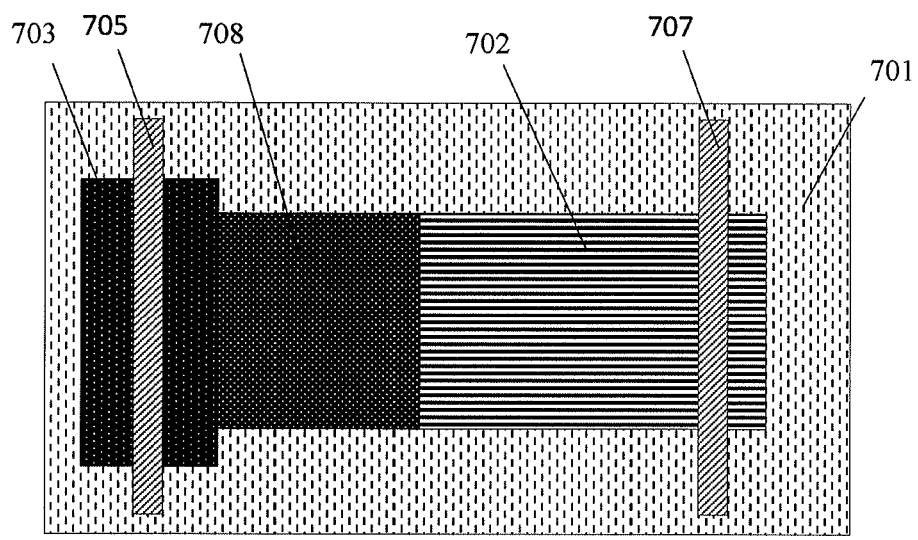

According to an embodiment of the present disclosure, the method may further include forming a source and a drain. FIGS. 13A-13B exemplarily illustrate the steps of forming the source 705 and the drain 707. These steps can be carried out, for example, by processes such as film growth, photolithography, etching and the like.

Figure 14A:
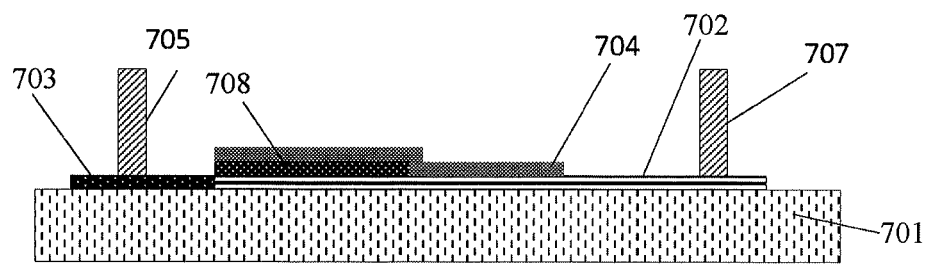
FIGS. 14A-14B exemplarily illustrate steps of forming a gate insulating layer according to an embodiment of the present disclosure.
Figure 14B:
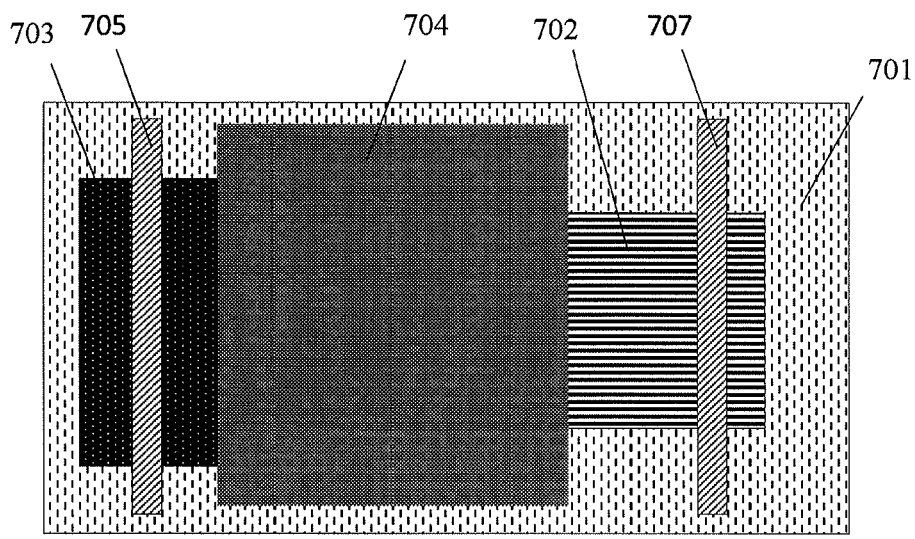

According to an embodiment of the present disclosure, the method may further include forming a gate insulating layer. FIGS. 14A-14B exemplarily illustrate the steps of forming a gate insulating layer 704. This step can be carried out, for example, with a method such as atomic layer deposition. Although the gate insulating layer 704 and the second graphene film 708 cover only a portion of the material 702 in FIGS. 14A-14B, those skilled in the art will appreciate that the gate insulating layer 704 and the second graphene film 708 may also cover the entire surface of material 702. When the gate insulating layer 704 and the second graphene film 708 cover the entire surface of the material 702, the drain 707 may be in contact with the material 702 through via holes formed in the gate insulating layer 704 and the second graphene film 708. Although the projected area of the second graphene film 708 on the material 702 may be less than the projected area of the gate insulating layer 704 on the material 702 in FIGS. 14A-14B, those skilled in the art will appreciate that the projected area of the second graphene film 708 on material 702 can also be greater than or equal to the projected area of the gate insulating layer 704 on material 702.

Figure 15A:
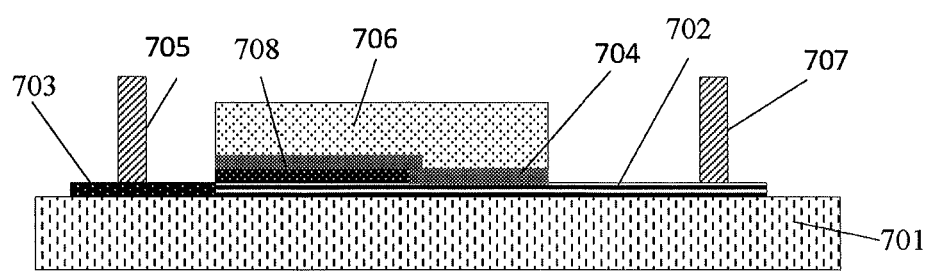
FIGS. 15A-15B exemplarily illustrate steps of forming a gate according to an embodiment of the present disclosure.
Figure 15B:
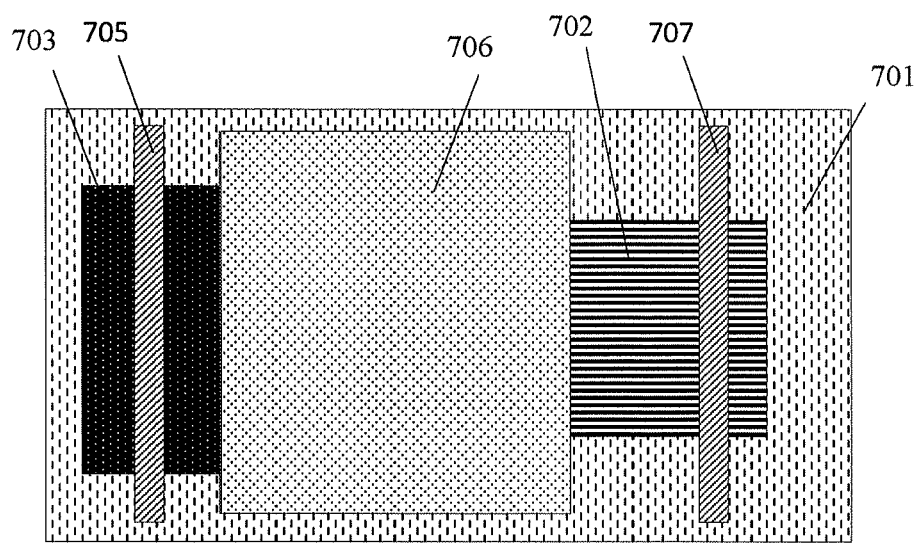

Step S3 will be described in detail below with reference to FIGS. 15A-15B. FIGS. 15A-15B exemplarily illustrate the steps of forming the gate 706. The gate 706 can be disposed on the gate insulating layer 704 and electrically insulated from the material 702 by the gate insulating layer 704. This step can be carried out, for example, by processes such as film growth, photolithography, etching and the like. The projection of the gate 706 on the material 702 at least partially overlaps with the projection of the gate insulating layer 704 and the second graphene film 708 on the material 702, and the projected area of the gate 706 on the material 702 can be less than or equal to the projected area of. the projected area of the gate insulation layer 704 or the second graphene film 708 on material 702. For example, as shown in FIGS. 15A-15B, the projected area of gate 706 on material 702 is equal to the projected area of the gate insulating layer 704 on material 702. In a possible embodiment of the present disclosure, the projected area of the gate 706, the gate insulating layer 704, and the second graphene film 708 on material 702 may be equal. Similarly, the gate 706 can be formed, for example, by processes such as thin film growth, photolithography, etching and the like. In use, the gate 706 can convert the second graphene film 708 into a narrow bandgap semiconductor by applying a voltage, thereby realizing a narrow bandgap/wide bandgap heterojunction channel. On the other hand, by controlling the thickness of the heterojunction formed by the second graphene film 708 and the material 702 through the gate 706, the switch state transition of the field effect transistor can be realized.

Those skilled in the art should understand that the above mentioned substrate 701, material 702, first graphene film 703, source 705, gate 706, drain 707, and second graphene film 708 are the same as the substrate 101, material 102, first graphene film 103, source 105, gate 106, drain 107, and second graphene film 108 in FIG. 1 respectively, and thus will not be repeatedly described herein.

Compared with related arts, a field effect transistor fabricated with the method according to an embodiment of the present disclosure can realize a subthreshold swing of less than 60 mV/Dec at room temperature, and can realize a smaller operating voltage, a similar on-state current and a smaller off-state current, reducing power consumption.

Those skilled in the art will appreciate that in some alternative embodiments, the steps shown in the flow charts can be performed in a different order than shown in the Drawings. For example, two blocks shown in succession may in fact be executed substantially in parallel, or sometimes in a reverse order, depending on actual requirements.

Figure 16:
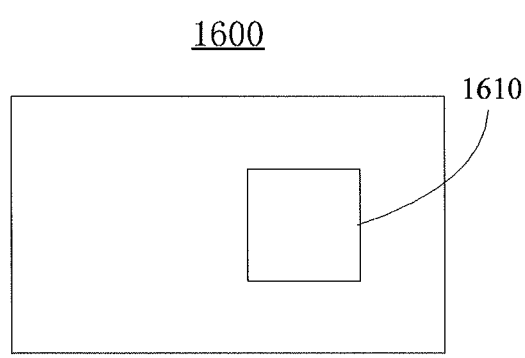
FIG. 16 shows a schematic block diagram of an electronic device according to an embodiment of the present disclosure.

FIG. 16 shows a schematic block diagram of an electronic device in accordance with an embodiment of the present disclosure. An electronic device 1600 may include a field effect transistor 1610 as described above with reference to FIG. 1 or FIG. 5. The electronic device 1600 can be, for example, an integrated circuit device, an electronic apparatus, a computer, or the like.

It should be understood by those skilled in the art that the present disclosure is not limited by the scope of the disclosure. Other variations or modifications may be made by those skilled in the art based on the disclosure above, and such changes or modifications are still within the scope of the present disclosure.

The invention claimed is:

1. A field effect transistor, comprising:
a source and a drain, the source being made of a first graphene film;
a channel disposed between the source and the drain, and comprising a laminate of a second graphene film and a material layer having semiconductor properties, the second graphene film being formed of bilayer graphene; and
a gate disposed on the laminate and electrically insulated from the laminate,
wherein the first graphene film and the material layer are in direct contact with a surface of a substrate, and the second graphene film is disposed directly on a first part of a surface of the material layer away from the substrate and physically separated from the substrate by the material layer;
wherein the first graphene film is previously disconnected from the second graphene film, and a projection of the first graphene film on the surface of the substrate is directly adjacent to a projection of the second graphene film on the surface of the substrate;
wherein a gate insulating layer is disposed directly on a surface of the second graphene film away from the material layer and directly on a second part of the surface of the material layer away from the substrate, and the second part is not covered by the second graphene film; and
wherein the gate is disposed on a surface of the gate insulating layer away from the substrate.

2. The field effect transistor according to claim 1, wherein the source is in electrical contact with the channel.

3. The field effect transistor according to claim 1, wherein the first graphene film and the second graphene film are both bilayer graphene films of an AB stack type.

4. The field effect transistor according to claim 1, wherein the material layer having semiconductor properties is n-doped or p-doped.

5. The field effect transistor according to claim 1, wherein the gate insulating layer is formed on the channel and has an equivalent oxide thickness of less than 2 nm.

6. The field effect transistor according to claim 1, wherein the drain is formed of the material layer having semiconductor properties.

7. The field effect transistor according to claim 1, wherein the drain is formed of a metal or a third graphene film.

8. The field effect transistor according to claim 1, wherein the material layer having semiconductor properties is formed by at least one of: a carbon nanotube, a semiconductor nanowire, a two-dimensional semiconductor material, and a three-dimensional semiconductor material.

9. A method of fabricating a field effect transistor, comprising:
forming a channel on a substrate;
forming a source and a drain on the substrate, such that the channel is disposed between the source and the drain;
forming a gate insulating layer on the channel; and
forming a gate on the channel such that a projection of the gate on the substrate overlaps with a projection of the channel on the substrate, wherein the gate is formed on a surface of the gate insulating layer away from the substrate;
wherein the source is formed of a first graphene film, the channel comprises a laminate of a second graphene film and a material layer having semiconductor properties, the second graphene film being formed of bilayer graphene, and the gate is electrically insulated from the laminate;
wherein the first graphene film and the material layer are in direct contact with a surface of the substrate, and the second graphene film is formed directly on a first part of a surface of the material layer away from the substrate and physically separated from the substrate by the material layer;
wherein the first graphene film is physically disconnected from the second graphene film, and a projection of the first graphene film on the surface of the substrate is directly adjacent to a projection of the second graphene film on the surface of the substrate; and
wherein the gate insulating layer is formed directly on a surface of the second graphene film away from the material layer and directly on a second part of the surface of the material layer away from the substrate, and the second part is not covered by the second graphene film.

10. The method according to claim 9, wherein the step of forming a source and a drain on the substrate further comprises electrically contacting the source with the channel.

11. The method according to claim 9, wherein the first graphene film and the second graphene film are both bilayer graphene films of an AB stack type.

12. The method according to claim 9, wherein the material layer having semiconductor properties is n-doped or p-doped.

13. The method according to claim 9, wherein the gate insulating layer has an equivalent oxide thickness of less than 2 nm.

14. The method according to claim 9, wherein the step of forming a source and a drain on the substrate further comprises forming the drain with the material layer having semiconductor properties.

15. The method according to claim 9, wherein the step of forming a source and a drain on the substrate further comprises forming the drain with a metal or a third graphene film.

16. The method according to claim 9, wherein the material layer having semiconductor properties is formed by at least one of: a carbon nanotube, a semiconductor nanowire, a two-dimensional semiconductor material, and a three-dimensional semiconductor material.

17. An electronic device comprising a field effect transistor, the field effect transistor comprising:
a source and a drain, the source being made of a first graphene film;
a channel disposed between the source and the drain, and comprising a laminate of a second graphene film and a material layer having semiconductor properties, the second graphene film being formed of bilayer graphene; and
a gate disposed on the laminate and electrically insulated from the laminate;
wherein the first graphene film and the material layer are in direct contact with a surface of a substrate, and the second graphene film is disposed directly on a first part of a surface of the material layer away from the substrate and physically separated from the substrate by the material layer;
wherein the first graphene film is physically disconnected from the second graphene film, and a projection of the first graphene film on the surface of the substrate is directly adjacent to a projection of the second graphene film on the surface of the substrate;

wherein a gate insulating layer is disposed directly on a surface of the second graphene film away from the material layer and directly on a second part of the surface of the material layer away from the substrate, and the second part is not covered by the second graphene film; and wherein the gate is disposed on a surface of the gate insulating layer away from the substrate.

18. The field effect transistor according to claim 1, wherein an area of a projection of the gate on the surface of the substrate is equal to an area of a projection of the gate insulating layer on the surface of the substrate.

19. The method according to claim 9, wherein an area of a projection of the gate on the surface of the substrate is equal to an area of a projection of the gate insulating layer on the surface of the substrate.

20. The electronic device according to claim 17, wherein an area of a projection of the gate on the surface of the substrate is equal to an area of a projection of the gate insulating layer on the surface of the substrate.

* * * * *